United States Patent
Lee et al.

(10) Patent No.: US 9,230,053 B2
(45) Date of Patent: Jan. 5, 2016

(54) RULE GENERATING APPARATUS AND METHOD USING LITHOGRAPHY SIMULATION

(71) Applicant: Samsung Electronics Co., Ltd., Suwon-si (KR)

(72) Inventors: Hyun-Jong Lee, Hwaseong-si (KR); Chul-Hong Park, Seongnam-si (KR); Roo-Li Choi, Seoul (KR); Duck-Hyung Hur, Seongnam-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 14/533,553

(22) Filed: Nov. 5, 2014

(65) Prior Publication Data

US 2015/0227673 A1    Aug. 13, 2015

(30) Foreign Application Priority Data

Feb. 12, 2014    (KR) .................. 10-2014-0016158

(51) Int. Cl.
*G06F 17/50*    (2006.01)
*H01L 21/027*    (2006.01)

(52) U.S. Cl.
CPC .......... *G06F 17/5081* (2013.01); *H01L 21/027* (2013.01)

(58) Field of Classification Search
CPC ..................... H01L 21/027; G06F 17/5081
See application file for complete search history.

(56) References Cited

U.S. PATENT DOCUMENTS

| | | |
|---|---|---|
| 6,470,489 B1 | 10/2002 | Chang et al. |
| 6,507,931 B2 | 1/2003 | Kotani et al. |
| 6,760,892 B2 | 7/2004 | Taoka et al. |
| 7,025,280 B2* | 4/2006 | Kaushal .................. G03F 1/144 118/50.1 |
| 7,120,882 B2 | 10/2006 | Kotani et al. |
| 7,123,356 B1* | 10/2006 | Stokowski ....... G01N 21/95607 356/237.2 |
| 7,133,119 B1* | 11/2006 | Pettibone ............. G01N 21/956 355/55 |
| 7,181,707 B2 | 2/2007 | Kotani et al. |
| 7,194,704 B2 | 3/2007 | Kotani et al. |
| 7,266,800 B2* | 9/2007 | Sezginer ............. G03F 7/70425 716/52 |
| 7,350,183 B2* | 3/2008 | Cui ......................... G03F 1/144 430/5 |
| 7,624,369 B2* | 11/2009 | Graur ....................... G03F 1/36 716/54 |
| 7,735,053 B2 | 6/2010 | Harazaki |
| 7,814,447 B2 | 10/2010 | Scheffer et al. |
| 7,882,456 B2 | 2/2011 | Zach |
| 7,900,170 B2* | 3/2011 | Suh ......................... G03F 1/144 716/53 |
| RE42,294 E | 4/2011 | Kotani et al. |
| RE42,302 E | 4/2011 | Kotani et al. |
| 7,921,383 B1* | 4/2011 | Wei ......................... G03F 7/705 703/13 |
| 7,962,863 B2* | 6/2011 | Su ........................... G03F 1/144 716/50 |

(Continued)

FOREIGN PATENT DOCUMENTS

| | | |
|---|---|---|
| JP | 2007199256 A | 8/2007 |
| JP | 2010122438 A | 6/2010 |
| KR | 1020000060456 A | 10/2000 |

*Primary Examiner* — Naum B Levin
(74) *Attorney, Agent, or Firm* — Myers Bigel Sibley & Sajovec, PA

(57) ABSTRACT

A design rule generating method is provided. The method includes receiving a test pattern, providing a plurality of workflows, which correspond to the test pattern and are preset in relation to a lithography model and a mask generation method, and performing simulation on the test pattern according to a workflow selected from the workflows.

20 Claims, 11 Drawing Sheets

(56) References Cited

U.S. PATENT DOCUMENTS

| | | | |
|---|---|---|---|
| 8,120,753 B2 * | 2/2012 | Berger | G03F 7/70216 355/67 |
| 8,122,385 B2 * | 2/2012 | Fukuhara | G03F 1/144 716/50 |
| RE43,659 E | 9/2012 | Kotani et al. | |
| 8,381,152 B2 | 2/2013 | Lai et al. | |
| 8,402,407 B2 | 3/2013 | Nojima | |
| 8,498,469 B2 * | 7/2013 | Xiao | G06K 9/036 355/53 |
| 8,542,340 B2 | 9/2013 | Ye et al. | |
| 8,543,947 B2 * | 9/2013 | Liu | G03F 1/144 716/53 |
| 8,612,919 B2 * | 12/2013 | Pikus | G06F 17/5081 716/102 |
| 2005/0167514 A1 * | 8/2005 | Kaushal | G03F 1/144 236/1 C |
| 2005/0240895 A1 * | 10/2005 | Smith | G03F 7/705 700/121 |
| 2009/0106715 A1 * | 4/2009 | Pikus | G06F 17/5081 716/106 |
| 2010/0037193 A1 | 2/2010 | Kyoh | |
| 2011/0113390 A1 * | 5/2011 | Cao | G03F 1/70 716/55 |
| 2012/0075605 A1 * | 3/2012 | Chen | H01L 21/027 355/67 |
| 2012/0220058 A1 | 8/2012 | Jung et al. | |
| 2012/0254813 A1 | 10/2012 | Chen et al. | |

\* cited by examiner

FIG. 2

| | Flow | SMO (Source Mask Co-optimization) | Existing Model | Model Generation | IMG (Ideal Mask Generation) | OPC (Optical Proximity Correction) | Existing Mask |
|---|---|---|---|---|---|---|---|
| WF1 | 1 | X | O | X | O | X | X |
| WF2 | 2 | X | O | X | X | O | X |
| WF3 | 3 | X | X | O | O | X | X |
| WF4 | 4 | X | X | O | X | O | X |
| WF5 | 5 | O | X | X | O | X | X |
| WF6 | 6 | O | X | X | X | O | X |
| WF7 | 7 | O | X | O | O | X | X |
| WF8 | 8 | O | X | O | X | O | X |
| WF9 | 9 | X | O | X | X | X | O |

FIG. 3-A
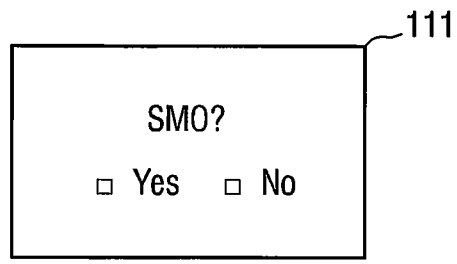
FIG. 3-B
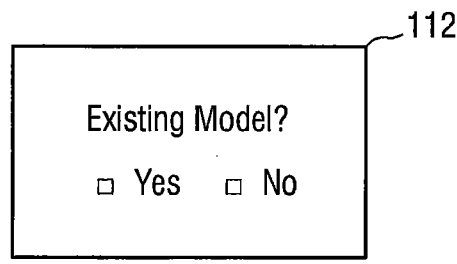
FIG. 3-C
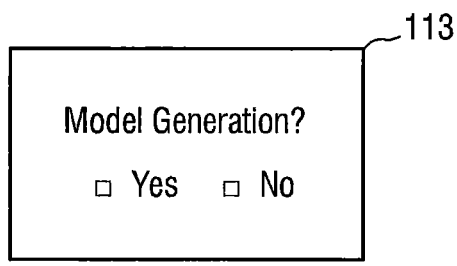
FIG. 3-D
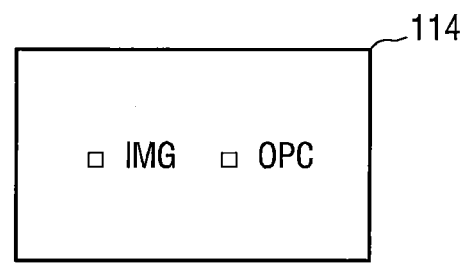

FIG. 4

| | 121 | 122 | | | | 123 | | | | | | |
|---|---|---|---|---|---|---|---|---|---|---|---|---|
| ID | Cutline | Inner_X | Inner_Y | Outer_X | Outer_Y | MEEF | DOF@EL | PVBAND (nm) | PVBAND (%) | NILS | ILS | ... |
| 1 | Cutline_X1 | 50 | 80 | 120 | 150 | 1.0 | 100 | 5 | 5 | 1.21 | 2.225669 | ... |
| 2 | Cutline_X1 | 50 | 80 | 120 | 200 | | 115 | 5 | 5 | 1.21 | 2.225669 | ... |
| ⋮ | ⋮ | ⋮ | ⋮ | ⋮ | ⋮ | ⋮ | ⋮ | ⋮ | ⋮ | ⋮ | ⋮ | ... |
| 99 | Cutline_Y1 | 50 | 80 | 120 | 150 | | | 8 | 10 | 2.736151 | 33.3676 | ... |
| 100 | Cutline_Y2 | 50 | 80 | 120 | 200 | | | 8 | 10 | 2.736151 | 33.3676 | ... |
| ⋮ | ⋮ | ⋮ | ⋮ | ⋮ | ⋮ | ⋮ | ⋮ | ⋮ | ⋮ | ⋮ | ⋮ | ... |

FIG. 5-A
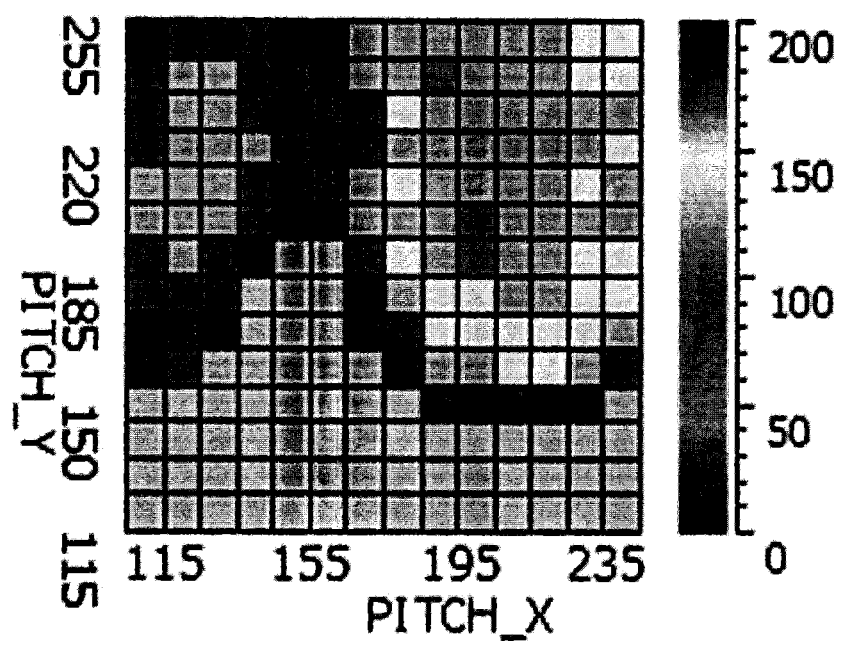

FIG. 5-B
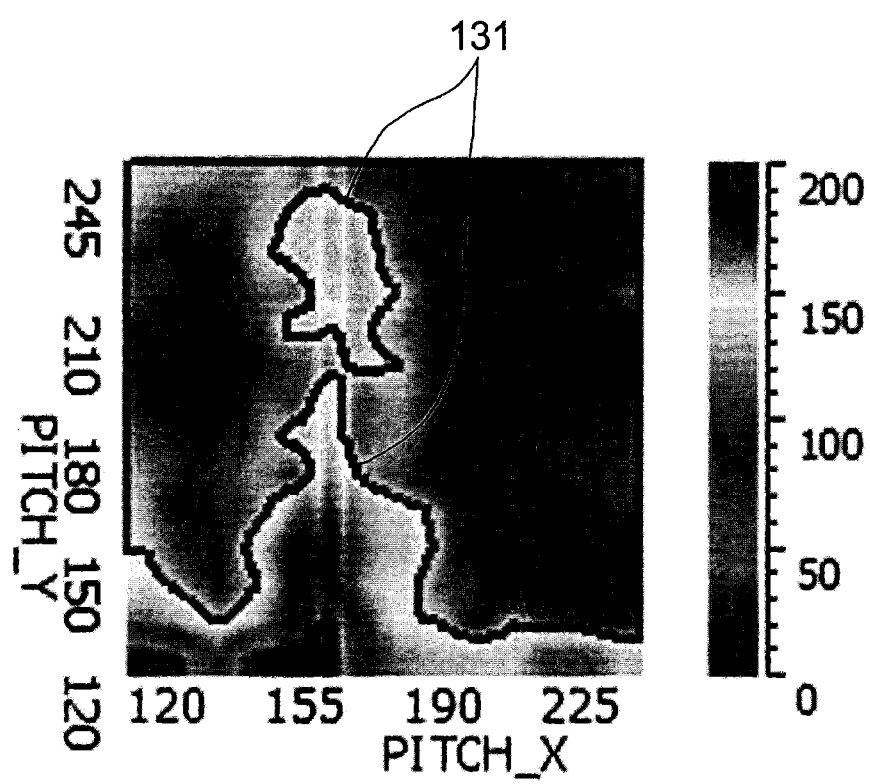

· Design Rule Table of Valid Region

| Design rule# | CD_Y | CD_Y | PITCH_Y | PITCH_X | Allowed Area |
|---|---|---|---|---|---|
| 1 | 100 | 40. | - | 115-250 | 0 |
| 2 | 100 | 45 | - | 115-250 | 0 |
| 3 | 100 | 50 | - | 115-250 | 0 |
| 4 | 90 | 40 | - | 115-250 | 0 |
| 5 | 90 | 45 | - | 115-250 | 0 |
| 6 | 90 | 50 | - | 115-250 | 0 |
| 7 | 80 | 40 | - | 115-250 | 0 |
| 8 | 80 | 45 | - | 115-250 | 0 |
| 9 | 80 | 50 | - | 115-250 | 0 |
| 10 | 70 | 40 | - | 115-250 | 0 |
| 11 | 70 | 45 | - | 115-250 | 0 |
| 12 | 70 | 50 | - | 115-250 | 0 |
| 13 | 60 | 40 | - | 115-250 | 0 |
| 14 | 60 | 45 | - | 115-250 | 0 |
| 15 | 60 | 50 | - | 115-250 | 0 |

RULE GENERATING APPARATUS AND METHOD USING LITHOGRAPHY SIMULATION

CROSS-REFERENCE TO RELATED APPLICATIONS

This application claims priority from Korean Patent Application No. 10-2014-0016158 filed on Feb. 12, 2014 in the Korean Intellectual Property Office, the disclosure of which is incorporated herein by reference in its entirety.

BACKGROUND

1. Field of the Invention

Embodiments of the inventive concept relate to a design rule generating apparatus using lithography simulation.

2. Description of the Related Art

A design rule is an essential element in the layout design development of semiconductor devices. To reflect process limitations in layout design, various layout patterns and process limit values are reflected in the design rule. In particular, photolithography process limitations may be reflected in the design rule. However, because it may not be possible to physically verify all layout patterns, the layout patterns are verified through simulation. Nonetheless, a lot of effort and time may be required to simulate, analyze and verify numerous layout patterns.

SUMMARY

Aspects of the inventive concept provide a design rule generating apparatus and method employed to easily perform photolithography simulation.

However, aspects of the inventive concept are not restricted to the one set forth herein. The above and other aspects of the inventive concept will become more apparent to one of ordinary skill in the art to which the inventive concept pertains by referencing the detailed description of the inventive concept given below.

According to an aspect of the inventive concept, there is provided a design rule generating method comprising receiving a test pattern, providing a plurality of workflows which correspond to the test pattern and are preset in relation to a lithography model and a mask generation method, and performing a simulation on the test pattern according to a workflow selected from the workflows.

The preset workflows are based on whether a usable lithography model exists.

The preset workflows are based on whether a new lithography model is to be generated.

The lithography model includes at least one of an optical model, a resist model, a process window model, and a defocus model.

The preset workflows are based on whether ideal mask generation (IMG) or optical proximity correction (OPC) is to be used.

The preset workflows are based on whether source mask optimization (SMO) is to be performed.

The providing of the workflows comprises displaying all selectable workflows simultaneously.

The providing of the workflows comprises displaying a first query about whether to perform SMO, displaying a second query about whether a usable lithography model exists after the first query, displaying a third query about whether to generate a new lithography model after the second query, displaying a fourth query about whether to use IMG or OPC after the third query.

The method may further comprise analyzing results of the simulation and extracting a design rule responsive to analyzing the results.

The method may further comprise receiving reference values of one or more parameters which are to be used to analyze the results of the simulation before the providing of the workflows.

According to another aspect of the inventive concept, there is provided a design rule generating method comprising receiving a test pattern, providing a plurality of workflows which correspond to the test pattern and are preset, performing simulation on the test pattern according to a workflow selected from the workflows, analyzing results of the simulation, extracting a design rule based on the analyzing the results, wherein the workflows are determined based on at least one of whether SMO is to be performed, whether a usable lithography model exists, whether a new lithography model is to be generated, and a type of a mask generation method.

The lithography model includes at least one of an optical model, a resist model, a process window model, and a defocus model.

The type of the mask generation method includes at least one of IMG and OPC.

The performing of the simulation, the analyzing of the results of the simulation, and the extracting of the design rule are performed as successive operations within one system.

According to still another aspect of the inventive concept, there is provided a design rule generating method comprising receiving a test pattern and reference values of one or more parameters, performing lithography simulation on the test pattern, determining pass or fail by comparing results of the lithography simulation with the reference values of the parameters, and extracting a design rule based on the pass or fail determination result.

The performing of the lithography simulation, the determining of pass or fail, and the extracting of the design rule are performed as successive operations within one system.

The performing of the lithography simulation comprises providing a plurality of workflows which correspond to the test pattern and are preset in relation to a lithography model and a mask generation method, and performing simulation on the test pattern according to a workflow selected from the workflows.

In the determining of pass or fail, the pass or fail determination result for each of the parameters is displayed on a graph.

In the determining of pass or fail, a common pass region for a plurality of parameters is displayed on a graph.

A function of jumping from the graph directly to raw data of the graph is performed at the request of a user.

The method may further comprise plotting a boundary, which is based on the reference values, on the graph.

Each of an x axis and a y axis of the graph represents dimension information of the test pattern.

In the extracting of the design rule, different forms of design rules are extracted according to a range set by a user.

In the extracting of the design rule, a minimum design rule value is output, or all usable design rule values are output in the form of a table.

In the extracting of the design rule, if a user selects a section of one axis of a graph, a valid region of another axis is output.

The parameters includes at least one of mask error enhancement factor (MEEF), depth of focus at specific exposure latitude (DOF@EL), exposure latitude at specific depth of focus (EL@DOF), process variation band (PVBAND), critical dimension variation (CDV), image log slope (ILS), and normalized image log slope (NILS).

According to still another aspect of the inventive concept, there is provided a design rule generating method comprising receiving a test pattern and reference values of one or more parameters, performing lithography simulation on the test pattern, determining pass or fail by comparing results of the lithography simulation with the reference values of the parameters and displaying the determination result on a graph, receiving extraction range of a design rule, and outputting a minimum design rule value or all usable design rule values in the form of a table according to the extraction range.

In the displaying of the determination result on the graph, the pass or fail determination result for each of the parameters is displayed on a graph.

In the displaying of the determination result on the graph, a common pass region for a plurality of parameters is displayed on a graph.

According to an aspect of the other inventive concept, there is provided a design rule generating apparatus comprising an input module receiving a test pattern, a control module providing a plurality of workflows which correspond to the test pattern and are preset in relation to a lithography model and a mask generation method, and a simulation module performing simulation on the test pattern according to a workflow selected from the workflows.

BRIEF DESCRIPTION OF THE DRAWINGS

The above and other aspects and features of the inventive concept will become more apparent by describing in detail exemplary embodiments thereof with reference to the attached drawings, in which:

FIGS. 2 through 3D are diagrams illustrating an operation of selecting a workflow in the design rule generating method of FIG. 1;

FIGS. 4 through 8 are diagrams illustrating an operation of analyzing simulation results in the design rule generating method of FIG. 1;

DETAILED DESCRIPTION OF THE EMBODIMENTS

Figure 1:
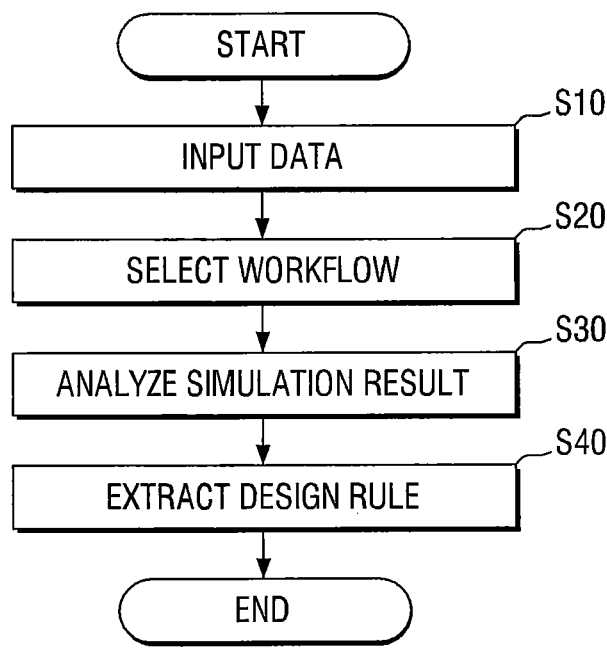
FIG. 1 is a flowchart illustrating a design rule generating method according to embodiments of the inventive concept.

The inventive concept will now be described more fully hereinafter with reference to the accompanying drawings, in which embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. The same reference numbers indicate the same components throughout the specification. In the attached figures, the thickness of layers and regions is exaggerated for clarity.

It will be understood that when an element or layer is referred to as being "connected to," or "coupled to" another element or layer, it can be directly connected to or coupled to another element or layer or intervening elements or layers may be present. In contrast, when an element is referred to as being "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, etc. may be used herein to describe various elements, these elements should not be limited by these terms. These terms are only used to distinguish one element from another element. Thus, for example, a first element, a first component or a first section discussed below could be termed a second element, a second component or a second section without departing from the teachings of the inventive concept.

The use of the terms "a" and "an" and "the" and similar referents in the context of describing the invention (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted.

Unless defined otherwise, all technical and scientific terms used herein have the same meaning as commonly understood by one of ordinary skill in the art to which this invention belongs. It is noted that the use of any and all examples, or exemplary terms provided herein is intended merely to better illuminate the invention and is not a limitation on the scope of the invention unless otherwise specified. Further, unless defined otherwise, all terms defined in generally used dictionaries and this specification may not be overly interpreted.

As will be appreciated by one skilled in the art, aspects of the present disclosure may be illustrated and described herein in any of a number of patentable classes or contexts including any new and useful process, machine, manufacture, or composition of matter, or any new and useful improvement thereof. Accordingly, aspects of the present disclosure may be implemented entirely hardware, entirely software (including firmware, resident software, micro-code, etc.) or combining software and hardware implementation that may all generally be referred to herein as a "circuit," "module," "component," or "system." Furthermore, aspects of the present disclosure may take the form of a computer program product comprising one or more computer readable media having computer readable program code embodied thereon.

Any combination of one or more computer readable media may be utilized. The computer readable media may be a computer readable signal medium or a computer readable storage medium. A computer readable storage medium may be, for example, but not limited to, an electronic, magnetic, optical, electromagnetic, or semiconductor system, apparatus, or device, or any suitable combination of the foregoing. More specific examples (a non-exhaustive list) of the computer readable storage medium would include the following: a portable computer diskette, a hard disk, a random access memory (RAM), a read-only memory (ROM), an erasable programmable read-only memory (EPROM or Flash memory), an appropriate optical fiber with a repeater, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device. Program code embodied on a computer readable signal medium may be transmitted using any appropriate medium, including but not limited to wireless, wireline, optical fiber cable, RF, etc., or any suitable combination of the foregoing.

Computer program code for carrying out operations for aspects of the present disclosure may be written in any combination of one or more programming languages, including an object oriented programming language such as Java, Scala, Smalltalk, Eiffel, JADE, Emerald, C++, C#, VB.NET, Python or the like, conventional procedural programming languages, such as the "C" programming language, Visual Basic, Fortran 2003, Perl, COBOL 2002, PHP, ABAP, dynamic programming languages such as Python, Ruby and Groovy, or other programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider) or in a cloud computing environment or offered as a service such as a Software as a Service (SaaS).

Aspects of the present disclosure are described herein with reference to flowchart illustrations and/or block diagrams of methods, apparatus (systems), and computer program products according to embodiments of the disclosure. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable instruction execution apparatus, create a mechanism for implementing the functions/acts specified in the flowchart and/or block diagram block or blocks.

These computer program instructions may also be stored in a computer readable medium that when executed can direct a computer, other programmable data processing apparatus, or other devices to function in a particular manner, such that the instructions when stored in the computer readable medium produce an article of manufacture including instructions which when executed, cause a computer to implement the function/act specified in the flowchart and/or block diagram block or blocks. The computer program instructions may also be loaded onto a computer, other programmable instruction execution apparatus, or other devices to cause a series of operational steps to be performed on the computer, other programmable apparatuses or other devices to produce a computer implemented process such that the instructions which execute on the computer or other programmable apparatus provide processes for implementing the functions/acts specified in the flowchart and/or block diagram block or blocks.

FIG. 1 is a flowchart illustrating a design rule generating method according to embodiments of the inventive concept. FIGS. 2 through 3D are diagrams illustrating an operation of selecting a workflow in the design rule generating method of FIG. 1. FIGS. 4 through 8 are diagrams illustrating an operation of analyzing simulation results in the design rule generating method of FIG. 1. FIG. 9 is a diagram illustrating an operation of extracting a design rule in the design rule generating method of FIG. 1.

First, referring to FIG. 1, data to be used for simulation, analysis and verification is input (operation S10).

Specifically, the data may include a test pattern, metrology, and reference values of one or more parameters. The test pattern may be one layout pattern, a layout pattern set composed of a number of patterns, or a real pattern. The metrology may be simulation region information, such as coordinate information of the test pattern.

The parameters may be one or more parameters used to analyze and verify simulation results. For example, the parameters may include at least one of mask error enhancement factor (MEEF), depth of focus at specific exposure latitude (DOF@EL), exposure latitude at specific depth of focus (EL@DOF), process variation band (PVBAND), critical dimension variation (CDV), image log slope (ILS), and normalized image log slope (NILS).

A plurality of workflows, which correspond to the test pattern and are preset in relation to a lithography model and a mask generation method are provided (operation S20).

Specifically, a workflow includes one or more operations needed to perform simulation using an input test pattern. A plurality of workflows may be determined in advance by a manufacturer or user of a design rule generating apparatus.

A plurality of workflows may be defined in relation to a lithography model. For example, a plurality of workflows may be defined according to whether a usable lithography model exists or whether a new lithography model is to be generated.

Here, the lithography model may include at least one of an optical model, a resist model, a process window model, and a defocus model. Additionally, the lithography model may include a mask model. The above types of lithography models are merely examples, and the scope of the embodiments of the inventive concept is not limited to this example.

Specifically, the optical model is a model for describing the formation of an aerial image by an exposure tool. The exposure tool is a tool used to project a mask image onto a wafer and is also referred to as a stepper or a scanner. Therefore, the optical model may include parameters of an illumination and projection system, such as numerical aperture, partial coherence settings, illumination wavelength, illuminator source shape, and possible system defects including lens optical aberrations and flare.

The resist model is a model for describing the absorption of an incident aerial image by resist, a development process for forming a final 3D resist pattern, etc. That is, the resist model is a model used to simulate the effect of projection light interacting with a photosensitive resist layer, a post-exposure bake (PEB) process, and a development process.

The process window model is a model used to predict the behavior, size, etc. of a process window. For example, the size of the process window may be predicted by calibrating an optical proximity correction (OPC) model using the best setting and a setting created by changing defocus/dose of the best setting. Specifically, model parameters may be calibrated by comparing critical dimension information of a sample test pattern in a wafer exposed at the setting created by changing defocus/dose from the best setting for generating a model with simulation results. In so doing, a process window model may be generated. That is, critical dimension data of each of a plurality of sample test patterns may be extracted in various process conditions, and then the critical dimension data of all process conditions are calibrated together. After that, parameters of a model that best reproduces the wafer shape are determined, and then the setting of a focus parameter or a dose parameter is changed to produce the best model and a defocus model. The defocus model is a model describing an aerial image predicted at each of a plurality of defocus points in an exposure-defocus (E-D) space.

The mask model is a model for describing the effect of the type and size of a mask. For example, the type of a mask may determine characteristics of the mask, such as attenuation, phase shifting design, etc.

A plurality of workflows may also be defined in relation to the mask generation method. For example, a plurality of workflows may be defined according to whether ideal mask generation (IMG) or OPC is to be used. IMG and OPC are used to change a mask so as to correct the optical proximity effect.

IMG is a method of dividing a test pattern into a plurality of pixels and optimizing the level of contribution of each pixel to a margin and a target layout. Mask rule check (MRC) constraints may be added to optimize the level of contribution of each pixel to be as close to a mass-production mask as possible.

OPC is a method of dividing a test pattern into a number of segments and calculating the effect of surrounding patterns at an edge of each segment. For example, an assist feature known as sub-resolution assisting feature (SRAF) may be provided around a main feature, or the geometry of the main feature may be changed.

A plurality of workflows may also be defined according to whether source mask optimization (SMO) is to be performed.

SMO is a technique for simultaneously optimizing a source (i.e., a light source and an exposure tool) and a mask. Because the source and the mask are correlated to each other, the shape of the mask may vary according to the source used For example, a Hamiltonian-based cost function for SMO may be as follows:

$$\mathcal{H}(\phi) = \int_\Omega |I^\omega(x,y) - T(x,y)|^2 dxdy$$

where $I^\omega$ is a printed wafer image, T is a target, and $\Omega$ is a wafer domain.

For mask optimization, a region inside a mask may be formed by $\{(x,y):\phi(x,y)\leq 0\}$, and a region outside the mask may be formed by $\{(x,y):\phi(x,y)>0\}$. In addition, for source optimization, a region where write pixels are OFF may be formed by $\{(p,q):\phi(p,q)>0\}$, and a region where the write pixels are ON may be formed by $\{(p,q):\phi(p,q)<0\}$.

Once the type of a source is determined, an optical model corresponding to a selected source may be determined.

The Hamiltonian-based cost function for SMO is merely an example, and embodiments of the inventive concept are not limited to this example.

When SMO is performed, an optical model may be generated according to a new illumination system. That is, during SMO, an optimum optical model may be automatically generated by a preset condition.

In the providing of the workflows (operation S20), all selectable workflows may be displayed simultaneously as illustrated in FIG. 2. For example, first through ninth workflows WF1 through WF9 may be displayed simultaneously, and simulation may be performed according to a workflow (e.g., the first workflow WF1) selected by a user. The user may select a workflow using an input tool such as a mouse, a keyboard, etc. While nine workflows WF1 through WF9 are used herein as an example, more or less than eight workflows can also be used as desired.

In the first workflow WF1, SMO is not performed. That is, an illumination system is already set, and an optical model according to the selection of an illumination system is not determined. Because a usable lithography model exists, a new lithography model is not generated. Simulation is performed based on the usable lithography model (e.g., the resist model) and using the IMG technique.

In the second workflow WF2, SMO is not performed, and a usable lithography exists. In addition, a new lithography model does not need to be generated, and the OPC technique is used.

In the third workflow WF3, SMO is not performed, and a usable lithography model does not exist. Therefore, a new lithography model is generated. Simulation is performed based on the newly generated lithography model and using the IMG technique.

In the fourth workflow WF4, SMO is not performed, and a usable lithography model does not exist. Therefore, a new lithography model is generated. Simulation is performed based on the newly generated lithography model and using the OPC technique.

In the fifth workflow WF5, SMO is performed. As an illumination system is determined, an optical model is also determined. A usable lithography model does not exist. However, as SMO is performed, an optimum optical model is generated as described above. Therefore, simulation is performed based on the optical model and using the IMG technique.

In the sixth workflow WF6, SMO is performed. As an illumination system is determined, an optical model is also determined. A usable lithography model does not exist. However, as SMO is performed, an optimum optical model is generated as described above. Therefore, simulation is performed based on the optical model and using the OPC technique.

In the seventh workflow WF7, SMO is performed. As an illumination system is determined, an optical model is also determined. A new lithography model is generated in addition to the optical model. In this case, simulation is performed based on the optical model or the newly generated lithography model and using the IMG technique.

In the eighth workflow WF8, SMO is performed. As an illumination system is determined, an optical model is also determined. A new lithography model is generated in addition to the optical model. In this case, simulation is performed based on the optical model or the newly generated lithography model and using the OPC technique.

In the ninth workflow WF9, if an existing model and an existing mask (e.g., an OPC mask) are available, simulation may be performed immediately.

Alternatively, referring to FIGS. 3A through 3D, in the providing of the workflows (operation S20), one of the workflows WF1 through WF9 may be determined through sequential queries. For example, sequential queries may be made as follows.

Referring to FIG. 3A, a first query about whether to perform SMO is displayed on a display device 111. A user selects YES or NO.

After the first query, a second query about whether a usable lithography model exists is displayed on the display device 112 as illustrated in FIG. 3B. The user selects YES or NO.

After the second query, a third query about whether to generate a new lithography model is displayed on the display device 113 as illustrated in FIG. 3C. The user selects YES or NO.

After the third query, a fourth query about whether to use IMG or OPC is displayed on the display device 114 as illustrated in FIG. 3D. The user selects IMG or OPC.

These queries may also be made sequentially in an order different from the above order. Alternatively, only some of the first through fourth queries may be made.

Referring back to FIG. 1, simulation results are analyzed (operation S30).

The simulation results may be output in the form of a table as illustrated in FIG. 4.

For example, the table may include a measure position (in a test pattern) section 121, a design rule value (of the test pattern) section 122, and a simulation result value section 123.

The measure position section 121 may include a plurality of cutlines (cutline_X1 through cutline_Y2). This is because a simulation result value can vary according to a measure position even in the same test pattern.

A design rule specified in the design rule value section 122 may vary according to a test pattern.

The simulation result value section 123 may show result values for a plurality of parameters. For example, the parameters may include at least one of MEEF, DOF@EL, EL@DOF, PVBAND, CDV, ILS, and NILS.

All or some of the simulation results output in the form of a table may be selected and plotted on a graph. That is, a certain measure position cutline_X1 or all measure positions cutline_X1 through cutline_Y2 may be selected. This function will hereinafter be referred to as a "measure position grouping function."

Figure 6:
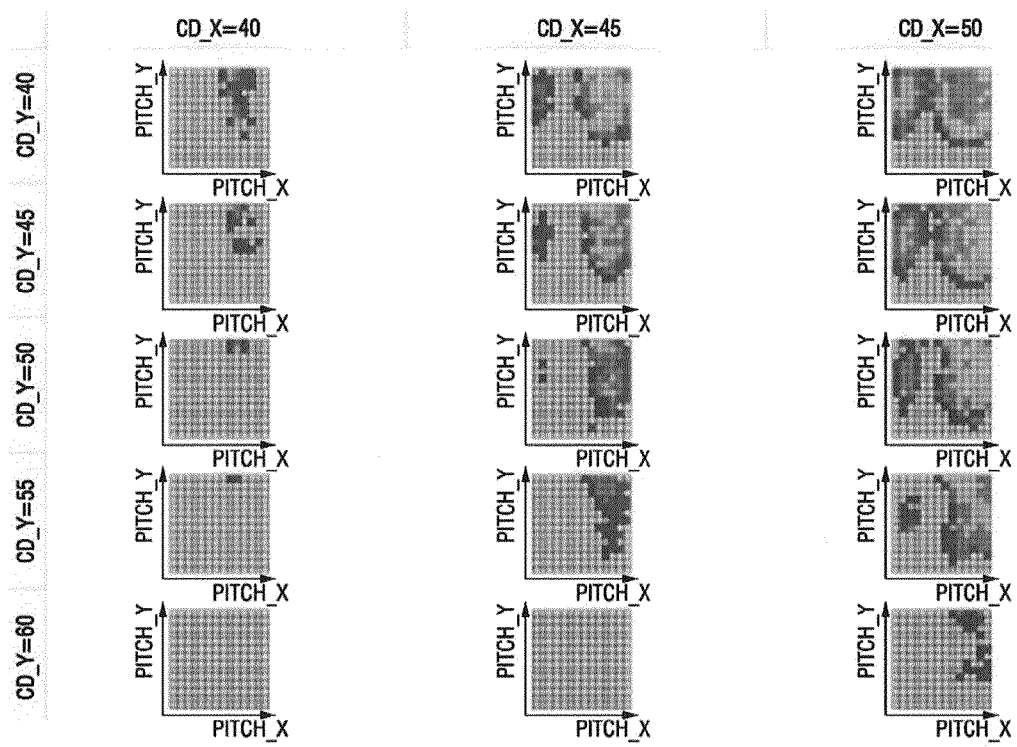

A simulation result graph may be created in a 2D format (see FIGS. 5A and 5B) or a 4D format (see FIG. 6). FIGS. 5A through 6 illustrate simulation results for each parameter. A pass or fail determination result may also be provided.

Referring to FIGS. 5A and 5B, the x axis and the y axis may be dimension information of a test pattern. For example, in FIGS. 5A and 5B, the x axis may be a pitch PITCH_X in an x direction, and the y axis may be a pitch PITCH_Y in a y direction. In FIG. 5A, simulation results are illustrated as dots. In FIG. 5B, simulation results are illustrated as successive values using a preset function. For example, a value between discrete values may be generated using an interpolation method.

In addition, as illustrated in the drawings, simulation results may be visualized using colors and displayed accordingly.

The pass/fail determination result may be displayed using the input reference value of each parameter (see operation S10 of FIG. 1). For example, a criterion boundary contour 131 of FIG. 5B is a boundary between pass and fail. A side of the criterion boundary contour 131 may be a pass region (i.e., a spec-in region), and the other side of the criterion boundary contour 131 may be a fail region (i.e., a spec-out region).

Referring to FIG. 6, simulation results in a 2D format (see FIG. 5A or 5B) may be arranged in a matrix to display the simulation results in a 4D format. The x axis and the y axis of the matrix may represent different dimension information. For example, the x axis and the y axis of the matrix may be, but are not limited to, critical dimension CD_X in the x direction and critical dimension CD_Y in the y direction, respectively.

Figure 7:
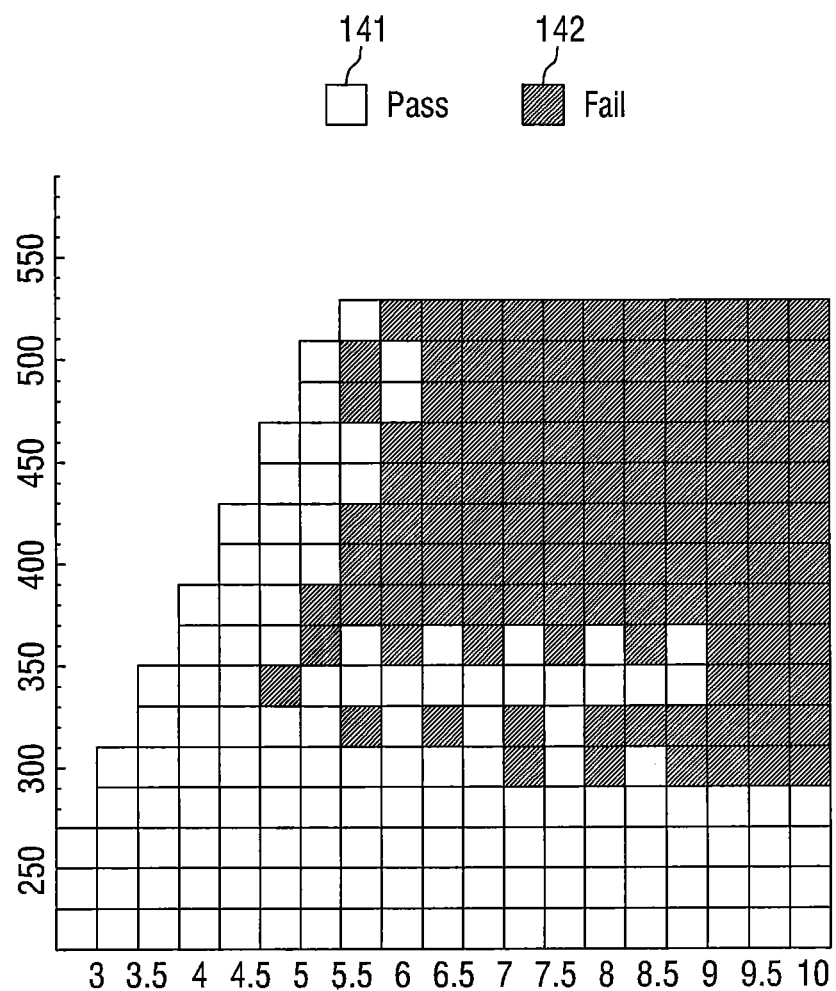

FIG. 7 illustrates simulation results for a plurality of parameters. Specifically, a common pass region 141 and a common fail region 142 for a plurality of parameters may be illustrated. In addition, a plurality of parameters to be used as criteria may be preset by a user. The common pass region 141 and the common fail region 142 may be determined for all parameters having the input reference values (see operation S10 of FIG. 1). The reference values may not be input by the user but may be input by a manufacturer at the time of manufacture. In this case, the common pass region 141 and the common fail region 142 may be determined for all parameters having the reference values. In FIG. 7, simulation results are displayed as dots. However, the simulation results may also be displayed as successive values using a preset function.

In FIGS. 5A through 7, a function of jumping from a graph directly to raw data of the graph may be performed at the request of a user. That is, when the user clicks on or designates a region of the graph, raw data corresponding to the designated region may be displayed.

Figure 8:
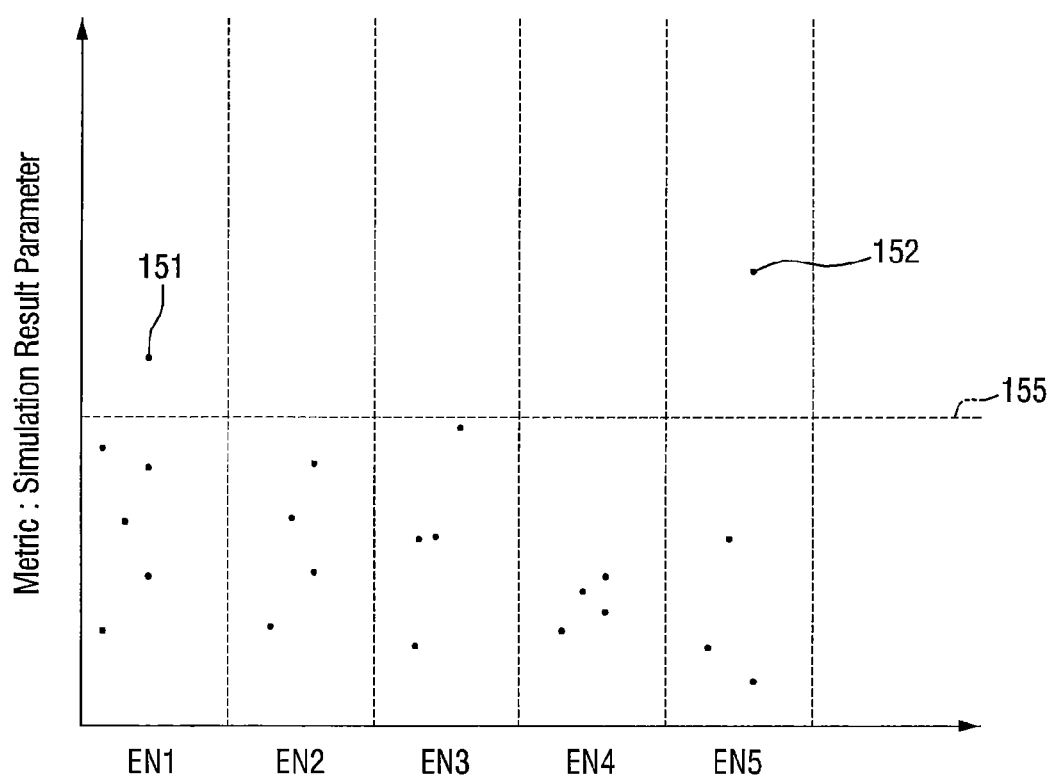
Figure 9:
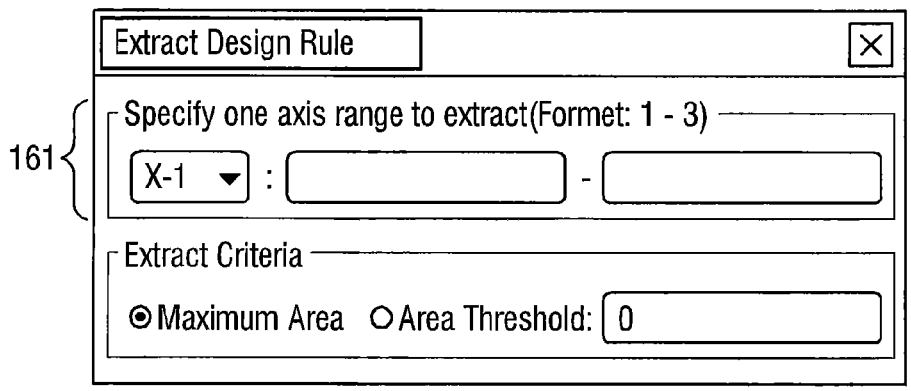
FIG. 9 is a diagram illustrating an operation of extracting a design rule in the design rule generating method of FIG. 1.

FIG. 8 illustrates the variation in design rule value with respect to surrounding environment. For example, while outliers 151 and 152 beyond a reference line 155 exist in certain surrounding environments EN1 and EN5, they do not exist in other surrounding environments EN2, EN3 and EN4. Thus, even if the same design rule is applied, risks posed by the change in the surrounding environment can be managed.

Referring back to FIG. 1, a design rule is extracted based on the result of simulation analysis (operation S40).

In the extracting of the design rule (operation S40), different forms of design rules may be extracted according to a range set by a user.

For example, a minimum design rule value may be output. Alternatively, all usable design rule values may be output in the form of a table. Alternatively, if a user selects a section of one axis (e.g., the x axis) of a graph, a valid region of another axis (e.g., the y axis) may be output. Specifically, referring to FIG. 9, when a user inputs a certain section (i.e., an extraction range) of an axis X-1, a design rule value may be output according to the extraction range, or all valid regions may be output in the form of a table.

The providing of the workflows and the selecting of the workflow (operation S20), the performing of simulation and the analyzing of the simulation results (operation S30), and the extracting of the design rule (operation S40) included in the design rule generating method according to the embodiments of the inventive concept may be performed as successive operations within one system. Therefore, it is possible to perform simulation, analysis and verification sequentially and easily by inputting data once and setting a simple workflow. In addition, simulation results can be plotted on a graph, and a design rule corresponding to the simulation results can be extracted. Therefore, various analyses are possible, and accurate results can be extracted.

Figure 10:
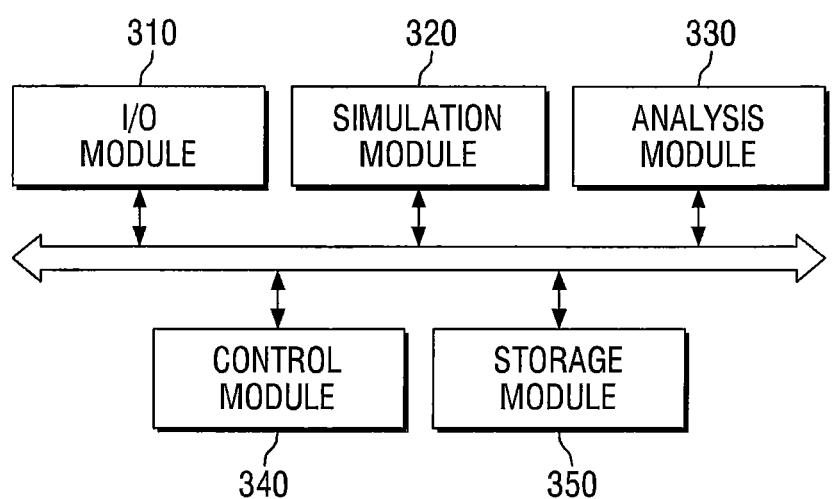
FIG. 10 is a block diagram of a design rule generating apparatus according to embodiments of the inventive concept.

FIG. 10 is a block diagram of a design rule generating apparatus according to embodiments of the inventive concept.

Referring to FIG. 10, the design rule generating apparatus according to the embodiments of the inventive concept may include an input/output (I/O) module 310, a simulation module 320, an analysis module 330, a control module 340, and a storage module 350.

The I/O module 310 receives data that are to be used for simulation, analysis, and verification. Specifically, the data may include a test pattern, metrology, and/or reference values of one or more parameters. The test pattern may be one layout pattern, a layout pattern set composed of a number of patterns, or a real pattern. The metrology may be simulation region information such as coordinate information of the test pattern. The parameters may be one or more parameters used to analyze and verify simulation results. For example, the parameters may include at least one of MEEF, DOF@EL, EL@DOF, PVBAND, CDV, ILS, and NILS.

The control module 340 provides a plurality of workflows, which correspond to a test pattern and are preset in relation to a lithography model and a mask generation method.

For example, the preset workflows may be based on at least one of whether a usable lithography model exists, whether a new lithography model is to be generated, and whether IMG or OPC is to be used.

Here, the lithography model may include at least one of an optical model, a resist model, a process window model, and a defocus model. Additionally, the lithography model may include a mask model.

The control module 340 may control the I/O module 310 to display all selectable workflows simultaneously (see FIG. 2). In other embodiments, the control module 340 may determine one of the workflows through sequential queries (see FIGS. 3A through 3D).

The simulation module 320 performs simulation on the test pattern according to a workflow selected from the workflows.

The analysis module 330 determines pass or fail by comparing the result of lithography simulation with a reference value of at least one input parameter. In addition, the analysis module 330 extracts a design rule according to the determination result.

The analysis module 330 determines pass or fail for each parameter and displays the determination result on a graph using the I/O module 310. Alternatively, the analysis module 330 determines pass or fail for a plurality of parameters and displays a common pass region on a graph using the I/O module 310.

Different forms of design rules may be extracted according to a range set by a user. For example, a design rule value may be output, or all usable design rule values may be output in the form of a table. In other embodiments, if the user selects a section of one axis of a graph, a valid region of another axis may be output.

As described above, simulation, analysis and verification can be performed as successive operations within one system by inputting data once and setting a workflow. In addition, simulation results can be plotted on a graph, and a design rule corresponding to the simulation results can be extracted. Therefore, various analyses are possible, and accurate results can be extracted.

The flowchart and block diagrams in the figures illustrate the architecture, functionality, and operation of possible implementations of systems, methods, and computer program products according to various aspects of the present disclosure. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

In concluding the detailed description, those skilled in the art will appreciate that many variations and modifications can be made to the preferred embodiments without substantially departing from the principles of the present invention. Therefore, the disclosed preferred embodiments of the invention are used in a generic and descriptive sense only and not for purposes of limitation.

That which is claimed:

1. A design rule generating method comprising:
receiving a test pattern;
providing a plurality of workflows which correspond to the test pattern and are preset in relation to a lithography model and a mask generation method; and
performing, using a special purpose computer, a simulation on the test pattern according to a workflow selected from the workflows.

2. The method of claim 1, wherein the preset workflows are based on whether a usable lithography model exists.

3. The method of claim 2, wherein the preset workflows are based on whether a new lithography model is to be generated.

4. The method of claim 1, wherein the lithography model comprises at least one of an optical model, a resist model, a process window model, and a defocus model.

5. The method of claim 1, wherein the preset workflows are based on whether ideal mask generation (IMG) or optical proximity correction (OPC) is to be used to change the mask to correct an optical proximity effect.

6. The method of claim 1, wherein the preset workflows are based on whether source mask optimization (SMO) is to be performed.

7. The method of claim 1, wherein the providing of the workflows comprises displaying the workflows simultaneously for selection.

8. The method of claim 1, wherein the providing of the workflows comprises
displaying a first query about whether to perform source mask optimization (SMO),
displaying a second query about whether a usable lithography model exists after the first query,
displaying a third query about whether to generate a new lithography model after the second query, and
displaying a fourth query about whether to use ideal mask generation (IMG) or optical proximity correction (OPC) to change the mask to correct an optical proximity effect after the third query.

9. The method of claim 1, further comprising analyzing results of the simulation and extracting a design rule responsive to analyzing the results.

10. The method of claim 9, further comprising receiving reference values of one or more parameters which are used to analyze the results of the simulation before the providing of the workflows.

11. A design rule generating method comprising:
receiving a test pattern;
providing a plurality of workflows, which correspond to the test pattern and are preset;
performing, using a special purpose computer, a simulation on the test pattern according to one of the workflows selected from the workflows;
analyzing results of the simulation; and
extracting a design rule responsive to analyzing the results,
wherein the workflows are determined based on at least one of whether source mask optimization (SMO) is to be performed, whether a usable lithography model exists, whether a new lithography model is to be generated, and a type of a mask generation method.

12. The method of claim 11, wherein the lithography model comprises at least one of an optical model, a resist model, a process window model, and a defocus model.

13. The method of claim 11, wherein the type of the mask generation method comprises at least one of ideal mask generation (IMG) and optical proximity correction (OPC) to change the mask to correct an optical proximity effect.

14. The method of claim 11, wherein the performing of the simulation, the analyzing of the results of the simulation, and the extracting of the design rule are performed as successive operations within one system.

15. A method, comprising:
 simulating, using a special purpose computer, a test pattern associated with a semiconductor device according to a workflow; and
 extracting a design rule based on simulating the test pattern;
 wherein simulating the test pattern and extracting the design rule are performed on a common processing apparatus.

16. The method of claim 15, wherein the workflow is selected from a plurality of workflows.

17. The method of claim 15, further comprising:
 providing a plurality of queries;
 receiving responses to the plurality of queries; and
 selecting the workflow based on the responses to the plurality of queries.

18. The method of claim 15, further comprising:
 displaying results of simulating the test pattern in a table format.

19. The method of claim 18, wherein the table format comprises a measure position of the test pattern section; a design rule value of the test pattern section, and a simulation result value section.

20. The method of claim 15, wherein extracting the design rule comprises extracting the design rule according to a defined value range.

* * * * *